United States Patent
Ohmi et al.

[11] Patent Number: 5,818,081
[45] Date of Patent: Oct. 6, 1998

[54] SEMICONDUCTOR DEVICE

[75] Inventors: Tadahiro Ohmi, 1-17-301, Komegabukuro 2-chome, Aoba-ku; Tadashi Shibata, 5-2, Nihondaira, Taihaku-ku, both of Sendai-shi, Miyagi-ken; Hideo Kosaka; Takeo Yamashita, both of Miyagi-ken, all of Japan

[73] Assignees: Tadahiro Ohmi; Tadashi Shibata, both of Miyagi-Ken, Japan

[21] Appl. No.: 656,288

[22] PCT Filed: Nov. 29, 1994

[86] PCT No.: PCT/JP94/02000

§ 371 Date: Jul. 1, 1996

§ 102(e) Date: Jul. 1, 1996

[87] PCT Pub. No.: WO95/15580

PCT Pub. Date: Jun. 8, 1995

[30] Foreign Application Priority Data

Nov. 30, 1993 [JP] Japan .................................. 5-300670

[51] Int. Cl.⁶ .................................................. H01L 29/76
[52] U.S. Cl. ........................ 257/319; 257/316; 327/427; 395/24
[58] Field of Search .................................... 257/316, 318, 257/319, 320; 327/427, 429; 395/24; 326/35, 36

[56] References Cited

U.S. PATENT DOCUMENTS

| 4,258,378 | 3/1981 | Wall | 257/316 |
| 5,258,657 | 11/1993 | Shibata et al. | 326/35 |
| 5,280,446 | 1/1994 | Ma et al. | 257/316 |
| 5,625,591 | 4/1997 | Kato et al. | 365/185.24 |

FOREIGN PATENT DOCUMENTS

| 62-88368 | 4/1987 | Japan | 257/320 |
| 3-6679 | 1/1991 | Japan | 257/319 |
| 3-144785 | 6/1991 | Japan . | |
| 4-333184 | 11/1992 | Japan . | |
| 5-335656 | 12/1993 | Japan | 257/319 |
| 6-20076 | 1/1994 | Japan . | |
| 6-125049 | 5/1994 | Japan . | |

Primary Examiner—Sara W. Crane
Attorney, Agent, or Firm—Baker & Daniels

[57] ABSTRACT

Synapse can be formed from a smaller number of elements in a low-power semiconductor device, which realize a highly integrated neural network. Precise modifications of synapse weighting become possible and a neuron computer chip of a practical level can be accomplished.

The semiconductor device includes a first electrode for charge injection, connected to a floating gate through a first insulating film; a second electrode for applying programming pulses, connected to the floating gate through a second insulating film, and a MOS transistor using the floating gate as its gate electrode, wherein the charge supplied from the source electrode of the MOS transistor sets the potential at the first electrode to a predetermined value determined by the potential of the floating gate, and charges are transferred between the floating gate and the first electrode through the first insulating film by applying a predetermined pulsating voltage to the second electrode.

1 Claim, 17 Drawing Sheets

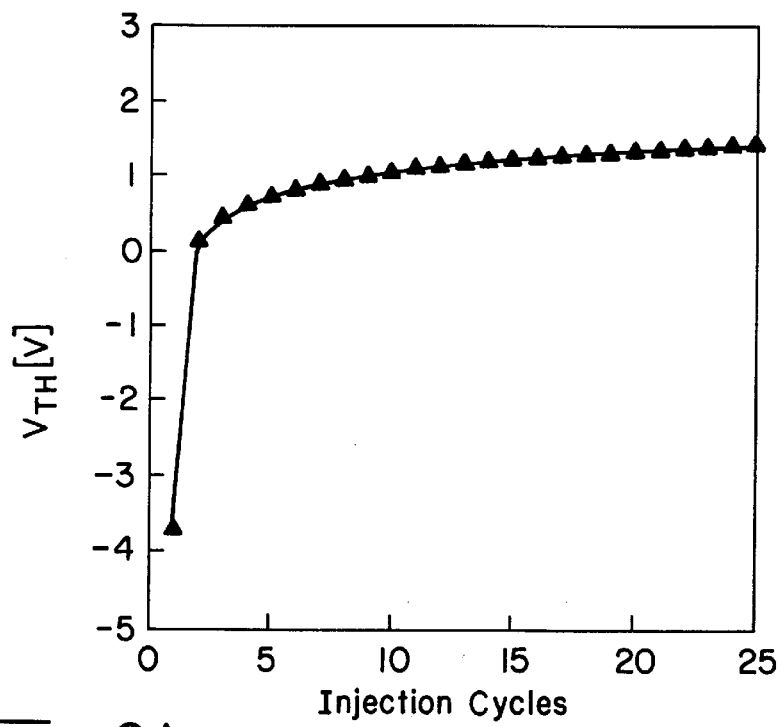
FIG. 6A Conventional Example
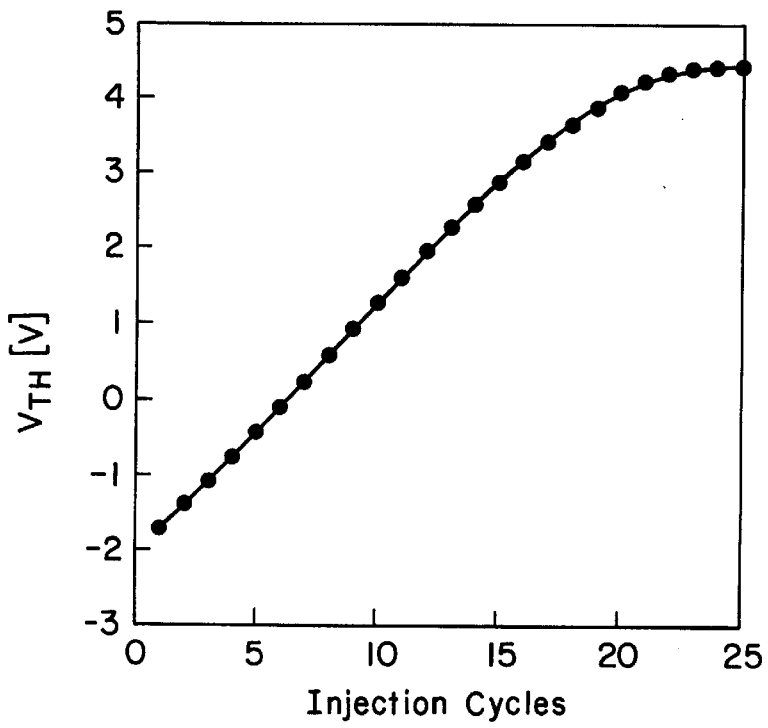
FIG. 6B Present Invention $$Z = \sum_{i=1}^{n} w_i V_i$$

SEMICONDUCTOR DEVICE

SPECIFICATION

1. Technological Field

The present invention relates to a semiconductor device, and in particular, provides a highly functional semiconductor integrated circuit device for the realization of neural network computers (neuron computers). Furthermore, the present invention provides a highly functional semiconductor integrated circuit device for the realization of multivalent analog memory.

2. Background of the Invention

The pace of development in semiconductor integrated circuit technology has been startling, so that, for example, using dynamic memory as an example, memories from 4 megabits to 6 megabits are already in production, while ultra-high density memories having capacities of 64 megabits or more are being realized at the level of research. In 64 megabit memories, approximately 120 million MOS transistors are integrated on a silicon chip measuring at most 1 cm$^2$. Such ultra LSI technology is applied not merely to memory circuits, but also to logical circuits; a variety of highly functional integrated circuits have been developed, beginning with CPUs of from 32 bits to 64 bits.

However, when such logical circuits are used to construct, for example, a computer employing a method in which digital signals, that is to say, signals having two values, "1" and "0", are used to conduct calculations, it is necessary to employ the Neumann method, in which instructions are executed one by one in accordance with a previously determined program. When such a method is employed, extremely high speed calculations are possible with respect to simple arithmetical calculations; however, an enormous amount of time is required for, for example, the calculations of pattern recognition or image processing or the like. Furthermore, such a method is highly disadvantageous for the type of data processing at which human beings excel, such as, for example, association, learning, and the like, and research is currently being conducted into various software technologies; however, the current state of affairs is such that rapid results have not been obtained. Here, a separate branch of research has been conducted in order to solve all these problems; in this research, the functioning of animal brains is being studied, and attempts are being made to develop computers which are capable of conducting calculations and processing which imitates such functions, that is to say, to develop neural circuit computers (neuron computers).

This research began in the 1940's; however, the field has become extremely active in recent years. This is the case because, in concert with the development of LSI technologies, it has become possible to realize such neuron computers in hardware.

However, there remain a number of problems with the realization of such neuron computers on LSI chips using present semiconductor LSI technology, and the goal of practical application has not yet been reached.

A discussion of the technological problems involved in the realization of such computers in terms of LSI follows.

The human brain has an extremely complex structure, and the functions thereof are of an extremely high level; however, the basic composition of the brain is extremely simple. That is to say, the brain comprises nerve cells having a calculating function, termed neurons, and nerve fibers, which transmit the results of such calculations to other neurons, thus serving, so to speak, as wiring.

In FIG. 14, a simplified model of the composition of the fundamental units of the brain is shown. References 1401$a$, 1401$b$, and 1401$c$ indicate neurons, while references 1402$a$, 1402$b$, and 1402$c$ indicate nerve fibers. 1403$a$, 1403$b$, and 1403$c$ are termed synapse junctions; these apply, for example, a weighting $w_a$ to a signal transmitted from, for example, nerve fiber 1402$a$, and input this into neuron 1401$a$. Neuron 1401$a$ calculates the linear sum of the signal strengths with are inputted thereinto, and when the total value thereof is in excess of a threshold value, the nerve cell becomes active, and outputs a signal to nerve fiber 1402$b$. If the total value is less than or equal to the threshold value, the neuron does not output a signal. The outputting of a signal by the neuron when this total value exceeds the threshold value is referred to as the 'firing' of the neuron.

In an actual brain, such calculations, transmission of signals, application of weighting, and the like are all conducted by means of electrochemical phenomena; the signals are transmitted and processed as electrical signals. The process of learning in human beings can thus be understood as the process of the alteration of weighting in the synapse junctions. That is to say, the weightings are progressively revised so as to obtain a correct output in response to a combination of a variety of inputted signals, and the weightings finally settle at the optimum values. That is to say, human intelligence is engraved in the brain as weightings in synapses.

A large number of neurons are connected to one another via synapses and thus form one layer. It is known that in the human brain, there are 6 layers, one on top of the other. The realization of this type of structure and function as an LSI system employing semiconductor devices is the most important task in the realization of neuron computers.

FIG. 15($a$) serves to explain the function of one nerve cell, that is to say, one neuron; this was proposed as a mathematical model in 1943 by McCullock and Pitts (Bull: Math. Biophys. Vol. 5, p.115(1943)). Currently, a great amount of research is being conducted into the realization of this model in semiconductor circuits and the construction thereby of a neuron computer. $V_1, V_2, V_3, \ldots, V_n$ indicate a number n of input signals which are defined in terms of, for example, voltage sizes; these correspond to the signals which are transmitted from other neurons. References $W_1, W_2, W_3, \ldots, W_n$ indicate coefficients which express the strength of the junctions between neurons; in biological terms, these are what are termed synapse junctions. The function of the neuron is to operate in such a manner that when a value Z comprising the linear sum of each input $V_i$ multiplied by the appropriate weight $W_i$ (i=1/n) is in excess of a fixed threshold value $V_{TH}{}^*$, a value of '1' is outputted, while when this value Z is smaller than the threshold value, a value of '0' is outputted. This can be expressed in the following manner:

(Arithmetical Formula 1)

$$Z = \sum_{i=1}^{n} w_1 V_i \quad (1)$$

$$V_{OUT} = 1(Z > V_{TH}{}^*) \quad (2)$$

$$0(Z < V_{TH}{}^*) \quad (3)$$

FIG. 15($b$) shows the relationship between Z and $V_{out}$; when Z is sufficiently larger than $V_{TH}{}^*$, a value of 1 is outputted, while when Z is sufficiently smaller than $V_{TH}{}^*$, a value of 0 is outputted.

When an attempt is made to realize this type of neuron as a combination of transistors, it is not merely the case that a large number of transistors are required, but it is also necessary to conduct the addition operation by converting each signal into an electrical current value, so that a large number of electrical currents are caused to flow, and a very large amount of power is consumed. In such a state of affairs, large scale integration is impossible. This problem was solved by the invention of the neuron MOSFET (abbreviated to vMOS) (inventors: Tadashi Shibata, Tadahiro Ohmi, Japanese Patent Application No. Hei 1-141463).

This invention succeeded in realizing the main functions of the operation of a neuron while employing only one transistor, and moreover, it was possible to conduct the addition operations of the voltage signals in an unconverted state, so that almost no power was consumed, and the invention was thus epoch-making in that respect. FIG. 16 indicates in simplified form an example of the cross sectional structure of this vMOS; 1601 indicates, for example, a P type silicon substrate, references 1602 and 1603 indicate a source and a drain formed by means of N$^+$ diffusion layers, reference 1604 indicates a gate insulating film (for example, SiO$_2$ or the like) which is provided on the channel region, reference 1606 indicates a floating gate which is electrically insulated and is in a potentially floating state, reference 1607 indicates an insulating film comprising, for example, SiO$_2$ or the like, and reference 1608 ($G_1$, $G_2$, $G_3$, $G_4$) indicates input gates, which correspond to the inputs of the neuron.

FIG. 17 shows a further simplification of the above in order to explain the operation of the vMOS. If the capacitive coupling coefficient between each input gate and the floating gate is represented by $C_G$, and the capacitive coupling coefficient between the floating gate and the silicon substrate is represented by $C_0$, then the potential Z of the floating gate can be expressed as follows:

$$Z = -w(V_1+V_2+V_3+V_4) \quad (4)$$

$$w \equiv C_G/(C_0+4C_G) \quad (5)$$

Here, $V_1$, $V_2$, $V_3$, and $V_4$ represent voltages which are inputted into, respectively, input gates $G_1$, $G_2$, $G_3$, and $G_4$, and the potential of the silicon substrate is 0 V; in other words, it is grounded.

If the floating gate is viewed as a gate electrode, then this vMOS is a standard N channel MOS transistor, and if the threshold voltage as seen from the floating gate (the voltage at which an inversion layer is formed on the surface of the substrate) is represented by $V_{TH}^*$, then when $Z>V_{TH}^*$, the vMOS enters an ON state, while when $Z<V_{TH}^*$, the transistor is in an OFF state. That is to say, if an inverter circuit such as that shown, for example, in FIG. 18 is built employing one such vMOS 1609, then it is possible to realize the functions of one neuron in a simple manner. References 1610 and 1611 indicate resistors which serve in the construction of the inverter, and reference 1612 indicates an NMOS transistor. FIG. 19 shows $V_{out1}$ and $V_{out2}$ as a function of Z; with respect to an input such that $Z>V_{TH}^*$, $V_{out2}$ outputs a high level voltage of $V_{DD}$. That is to say, the state of the firing of the neuron is realized.

As shown in Formula (4), it is possible to realize the fundamental operation of the neuron, in which the inputs into the neuron are added at the level of voltage and the neuron fires when the linear sum thereof is in excess of the threshold value, by means of only one vMOS. Voltage mode addition is conducted, so that the only current flowing in the input portion is the charge and the discharge current of the capacitor, and the size thereof is very small. In the inverter, a direct current is caused to flow when the neuron fires; however, this is because resistor 1610 is employed as a load, and if a vMOS gate having a CMOS structure in accordance with the above described invention (Japanese Patent Application No. Hei 1-141463) is employed, it is possible to eliminate this direct current.

FIGS. 20 and 21 show examples of the CMOS structure. FIG. 20 shows the cross sectional structure of the CMOS neuron gate in a schematic manner; reference 2001 indicates a P type silicon substrate, reference 2002 indicates an n type well, references 2003a and 2003b indicate, respectively, a N$^+$ source and drain, references 2004a and 2004b indicate, respectively, a P$^+$ type source and drain, reference 2005 indicates a floating gate, and references 2006a–d indicate, respectively, input gate electrodes. References 2007 and 2008 indicate insulating films comprising, for example, SiO$_2$, while reference 2009 indicates a field oxide film. FIG. 21 indicates an example of the structure of one neuron circuit; reference 2010 indicates the CMOS neuron gate of FIG. 20, represented symbolically, and portions thereof which are numbered correspond to the numbering in FIG. 20. Reference 2011 indicates a CMOS inverter, while references 2012 and 2013 indicate, respectively, a NMOS transistor and PMOS transistor. Furthermore, reference 2014 indicates the output of the neuron.

It is possible to construct a neuron using a small number of elements in the above manner, and moreover, since the power consumption is extremely small, the vMOS is an indispensable element for the realization of a neuron computer.

However, in order to realize the neuron computer, another important element aside from the neuron is necessary, that is to say, the synapse. FIG. 22 shows an example of the basic structure of a neuron circuit which also contains synapse junctions constructed using conventional technology.

Reference 2201 indicates a neuron circuit such as that shown, for example, in FIG. 18, and reference 2202 indicates wiring which transmits output signals from other neurons. Reference 2203 indicates synapse junction circuitry; this circuitry serves to impart a weighting to the inputted signal. This comprises a source follower circuit in which a load resistance (R+$R_x$) is connected to the source 2206 of the NMOS transistor 2204. Accordingly, when the output signal $V_S$ of a neuron which has fired is applied to the gate electrode 2205 of the NMOS transistor, a voltage of $V_S-V_{TH}$ arises in source 2206 (here, $V_{TH}$ indicates the threshold of the NMOS transistor 2204).

For example, if a MOS transistor in which $V_{TH}=0$ is employed, then the potential of source 2206 is equal to $V_S$, this voltage is divided among the two resistors R and $R_x$, and forms the output voltage of the synapse junction circuitry; this is transmitted to neuron 2201 by means of wiring 2207. The output voltage thereof is $V_S \cdot R_x/(R+R_x)$; a weighting comprising $R_x/(R+R_x)$ is thus multiplied by the signal voltage $V_S$. It is possible to modify the weighting by means of the alteration of the value of $R_x$.

FIG. 23 shows an example of a method for the realization of variable resistance. If a constant voltage $V_{GG}$ is applied to the gate of one MOS transistor 2301, then this transistor will function as a single resistor. It is possible to modify the resistance value by means of changes in the value of $V_{GG}$.

Furthermore, FIG. 23(b) shows an example of the circuitry for controlling the value of $V_{GG}$; this comprises a 4 bit binary counter 2302 and a D/A converter 2303. The junction strength of the synapse is expressed as a 4 bit binary number; this is converted to an analog voltage by means of D/A converter 2303 and outputted as the value of $V_{GG}$. In order to strengthen the synapse junction strength, a countdown is is effected in the value of the counter by means of a control signal, and the value of $V_{GG}$ is thus reduced. On the other hand, when the synapse junction is to be weakened, a count-up is effected, and the value of $V_{GG}$ thus increases.

The difficulties involved in the use of synapse junction circuitry such as that shown in FIGS. 22 and 23 will be discussed below.

First, the first difficulty involves the voltage division by means of resistors which generates the weighting in FIG. 22. When this method is employed, the output voltage multiplied by the weighting is maintained by means of continuously causing a current to flow to the resistors, so that power is constantly consumed in an amount of $V_S^2/(R+R_x)$. When this is the case, even if the power consumption is reduced by means of the application of vMOS in the neuron 2201, the power consumption of the circuitry as a whole will not be sufficiently reduced. If a two layer neural network, in which one layer comprises a number n of neurons, is considered, then the number of synapse junctions reaches $n^2$, and there are many more synapses then neurons. Accordingly, to the extent that synapse junction circuitry which requires that a current continually be caused to flow is employed, the construction of a neural network of a scale suited to practical application causes excessive power consumption, and it is thus in practice impossible to design such a system. It is possible to reduce the power consumption by means of setting $R+R_x$ to a sufficiently high value; however, in such a case, the time constant required for the charging and discharging of $C_{out}$ is extremely large and the operating speed of the synapse circuit is worsened significantly.

The second problem is that the circuitry shown in FIG. 23(b) which determines the weighting in question of the junctions requires a large number of elements, and can not be integrated on a large scale. In order to construct a neural network having a learning function, it is necessary that the strength of each synapse junction may be appropriately altered, and that the values altered in this manner may be stored. In FIG. 23(b), a 4 bit binary counter is employed for this purpose; however, even for this, a minimum of 30 MOS transistors are required. Additionally, a large number of elements are required to construct the D/A converter. Furthermore, these circuits consume a large amount of power per synapse junction, and this is also disadvantageous from the point of view of power consumption.

A method in which an EPROM or $E^2$PROM non-volatile memory of a floating gate type is employed has been proposed as a method for the reduction of the number of elements necessary for synapse construction. In such devices, the threshold value changes based on the amount of charge within the floating gate, so that it is possible to store weighting in an analog manner by means of the amount of charge. The weighting is stored in one transistor, so that each individual synapse circuit can be made smaller in comparison with the circuitry shown in FIG. 23(b). However, in order to read this out as a weighting, and to multiply this by the output of the previous stage neuron, it is of course the case that correspondingly complex circuitry is required. For example, if a differential amplifier circuit using two $E^2$PROM memory cells is constructed (D. Soo and R. Meyer, "A Four-Quadrant NMOS Analogue Multiplier," IEEE J. Solid State Circuits, Vol. sc-17, No.6, December 1982) the results of the multiplication by the weighting are read out as electrical current signals. It is thus not merely the case that a large simplification of the circuitry can not be achieved but also that the power consumed in the process of multiplication by the weighting by means of a constantly flowing current is extremely large, so that such structures can not be used in the construction of a large scale neural network.

A further serious problem is shown in FIG. 24.

FIG. 24(a) shows the threshold voltage ($V_{TH}$) of a $E^2$PROM cell having a tunnel junction as a function of the number of pulses used for data writing. The program voltage is 19.5 V, and the width of the pulse is 5 msec. When a positive pulse is applied to the control electrode for the program, electrons are injected into the floating gate, and the threshold value is shifted in a positive direction. In the opposite case, if a negative pulse is applied, electrons are released from the floating gate, and the threshold value is shifted in a negative direction. As is clear from the Figures, the threshold value is greatly shifted as a result of the initial pulse, and only extremely small variations are seen as a result of subsequent pulses. In this case, it is impossible to adjust the synapse weighting to a large number of levels by fine alterations in the threshold value.

The reason for this can explained in the following manner.

FIG. 24(b) shows the state of the change over time in the number (n) of electrons injected into the floating gate when a positive program voltage is applied in the form of a step function. It can be seen that a large number of electrons are injected at the initial period of voltage application, and this number subsequently exhibits almost no increase. This forms the basis of charge injection. This is so because the current flowing through the insulating film, termed Fowler-Nordheim tunneling, is dependent on a difference in potential V between the two ends of the insulating film, in accordance with the following formula:

(Arithmetical Formula 2)

$$I \propto V^2 \exp(-b/V) \tag{6}$$

That is to say, when the number of electrons in the floating gate increases as a result of the initial tunneling current, the potential of the floating gate decreases as a result of this, V becomes smaller, and as a result, the tunneling current decreases exponentially. In order to regulate the tunneling current at a constant value, and to precisely modify the synapse weighting, it is necessary to precisely control the size of the pulse voltage or the pulse width in accordance with the amount of the charge within the floating gate, and this results in a need for further large amounts of circuitry.

In short, it must be said that the construction of a neural network using the conventionally known technology is essentially impossible from the point of view of a reduction in power consumption to a low level, large scale integration, and precision of synapse weighting. Accordingly, it is impossible to realize a neuron computer using conventional technology.

The present invention was created in order to solve the problems described above; it provides a semiconductor device which is capable of realizing synapse junctions having an extremely small power consumption and employing a small number of elements, and which is capable of realizing a neuron computer chip which is integrated on a large scale, allows highly precise synapse weighting, and which has a low level of power consumption.

DISCLOSURE OF THE INVENTION

The semiconductor device in accordance with the present invention is provided with: a floating gate which is electrically insulated; a first electrode for charge injection, which is connected via a first insulating film with the floating gate; at least one second electrode for programming pulse application, which is connected to the floating gate via a second insulating film; and at least one MOS type transistor which uses the floating gate as the gate electrode thereof; characterized in that a mechanism for setting the potential of the first electrode to a predetermined value determined by the potential of the floating gate, by means of a charge supplied from the source electrode of the MOS transistor; and a mechanism for the transferring of charges between the floating gate and the first electrode, via the first insulating film, by means of the application of predetermined voltage pulses to the second electrode, are provided.

The present semiconductor device makes possible the construction of synapse junctions using a small number of elements, and moreover, has extremely small power consumption, so that the large scale integration and reduction in power consumption to a low level of neural networks become possible. Furthermore, the highly precise modification of synapse weighting values becomes possible, and as a result of this, it is possible to realize for the first time a neuron computer chip having practical application.

BRIEF DESCRIPTION OF THE DRAWINGS

FIGS. 6(a)–6(b) show actually measured data for the purposes of comparing the embodiment of the present invention with a conventional example.

In FIG. 15.

In FIG. 23, FIG. 23(a) is a circuit diagram showing an example of a method for the realization of variable resistance, while

In FIG. 24, FIG. 24(a) is a graph showing the threshold voltage of an EPROM cell having tunneling junctions as a function of the number of pulses used for data writing, while

DESCRIPTION OF THE PREFERRED EMBODIMENT (Embodiment 1)

Figure 1:
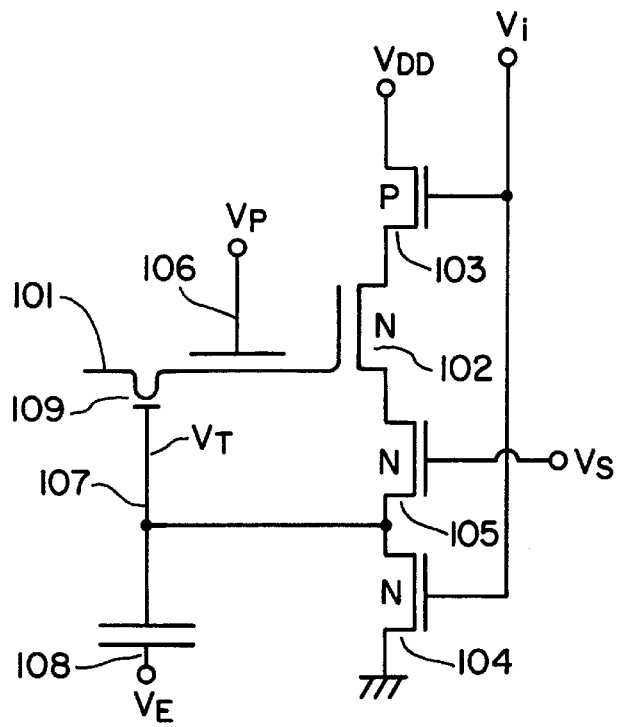
FIG. 1 is a circuit diagram which plains a first embodiment of the present invention.

A first embodiment of the present invention is shown in FIG. 1. In the Figure, $V_i$ represents a control signal which can take the values of, for example, $V_{DD}$, or 0.

Reference 101 indicates a floating gate; this forms the gate electrode of NMOS transistor 102. Reference 103 indicates a PMOS transistor, and references 104 and 105 indicate NMOS transistors. The gates of PMOS 103 and NMOS 104 are connected to the $V_i$ signal line, while the gate of NMOS 105 is connected to the $V_s$ signal line. $V_P$ indicates an electrode for programming pulse application; this can also be used as an input gate for determining the potential of floating gate 101. Furthermore, $V_E$ also represents an electrode for programming pulse application. A $SiO_2$ film of a thickness of, for example, 100 Å, is formed between floating gate 101 and writing electrode 107; when the difference in potential between these two is sufficiently large, for example, when this difference reaches a level of $10_V$, a current flows as a result of the Fowler-Nordheim tunneling phenomenon, and the amount of charge $Q_F$ within floating gate 101 changes. If the potential of the floating gate is represented by $\Phi_F^S$, then this is represented by the following formula:

$$\Phi_F^S = (C_P V_P + C_T V_T + Q_F)/(C_P + C_T + C_0) \quad (6)$$

Here, $C_P$ represents the capacity between $V_P$ electrode 106 and floating gate 101, $C_T$ represents the capacity between $V_T$ electrode 107 and the floating gate, while $C_0$ represents the floating capacity. Furthermore, the capacity between $V_E$ electrode 108 and electrode 107 is represented by $C_E$. Next, the operation of this circuitry will be explained.

Figure 2:
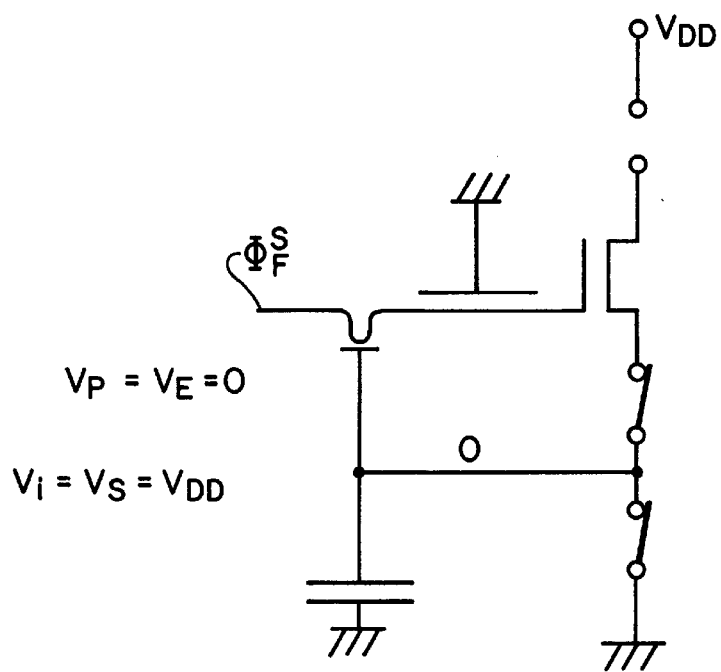
FIG. 2 is a circuit diagram which explains the first embodiment of the present invention.
Figure 3:
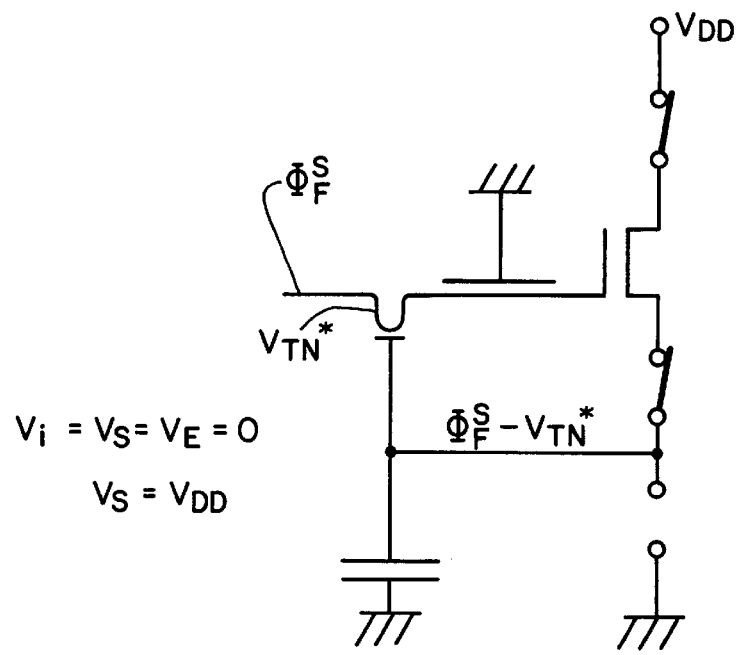
FIG. 3 is a circuit diagram which explains the first embodiment of the present invention.
Figure 4:
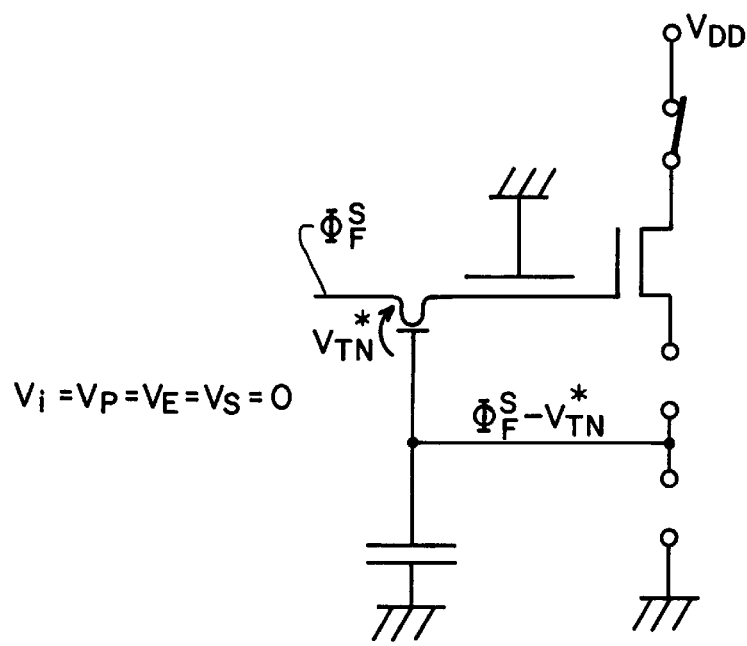
FIG. 4 is a circuit diagram which explains the first embodiment of the present invention.

For the purposes of simplicity the threshold value of NMOS 105 is set to 0 V, and furthermore, $C_T$, $C_0 \ll C_P$, and $C_E$ are established so that $C_T = C_0 = 0$, so that this may be ignored. At first, in the standby state, that is to say, when $V_P = V_E = 0$, and $V_i = V_s = V_{DD}$, PMOS 103 is in an OFF state, and NMOS 104 and 105 are in an ON state, and the circuitry can be written equivalently to that in FIG. 2. Next, if $V_i$ is set equal to 0, then PMOS 103 enters an ON state, and NMOS 104 enters an OFF state, so that the circuit becomes equivalent to that in FIG. 3. At this time, a current flows from power source $V_{DD}$ into $V_T$ terminal 107 via NMOS transistors 102 and 105, so that the potential thereof rises, and this rise in potential continues until NMOS transistor 102 enters an OFF state. Accordingly, the final value thereof is $\Phi_F^S-V_{TN}^*$. Here, $V_{TN}^*$ represents the threshold value as seen from the floating gate of NMOS 102. At this time, if $\Phi_F^S-V_{TN}^*$ is presumed to be within the range of the power source voltage, then the difference in potential between electrode 107 and floating gate 101 is not dependent on the amount of charge $Q_F$ within the floating gate, and this is constantly at a level of $V_{TN}^*$ when viewing the floating gate from electrode 107. After this, $V_S$ is set equal to 0, and when NMOS 105 enters an OFF state, then the $V_T$ terminal enters a floating state while maintaining a potential of $\Phi_F^S-V_{TN}^*$. This is shown in FIG. 4. In this state, when electrons are injected into the floating gate, if the program voltage is set to $V_{PP}$ ($V_{PP}$ represents a voltage equivalent to, for example, 10 V $-V_{TN}^*$), and $V_P$ is set equal to $V_{PP}$, and if $\Phi_F^S-V_{TN}^*$ is within the range of the power source voltage, then the voltage which is applied to tunnel oxide film portion 109 is not dependent on the amount of charge $Q_F$ within the floating gate, but rather, a constant voltage of $V_{PP}+V_{TN}^*$ (that is, 10 V), when viewing the floating gate from electrode 107, is applied, so that using fixed pulse conditions, fixed tunneling is produced, and a fixed amount of electrons, independent of the amount of charge $Q_F$ within the floating gate, is injected into the floating gate. Furthermore, when electrons are removed from the floating gate, if the program voltage is set to $V_{PP}'$ (where $V_{PP}'$ is a voltage equivalent to 10 V$+V_{TN}^*$), and $V_E$ is set equal to $V_{PP}$, then if $\Phi_F^S-V_{TN}^*$ is within the range of the power source voltage, the voltage which is applied to the tunneling oxide film portion 109 is independent of the amount of charge $Q_F$ within the floating gate, and a constant voltage of $-V_{PP}'+V_{TN}^*$ (that is to say, $-10$ V), when viewing the floating gate from electrode 107, is applied, so that if fixed pulse conditions are employed, a fixed tunneling is produced, and a fixed amount of electrons, independent of the amount of charge $Q_F$ within the floating gate, is removed from the floating gate. Furthermore, when removing electrons from the floating gate, the same process can be conducted even if $V_P$ is set equal to $-V_{PP}$. After injection or removal (after application of the program voltage, or after the voltage of the electrode applying the program voltage has been set to 0 V), $V_i=V_S=V_{DD}$ (irrespective of the order of the switching) is set, and the device is thus placed in the standby state.

Figure 5:
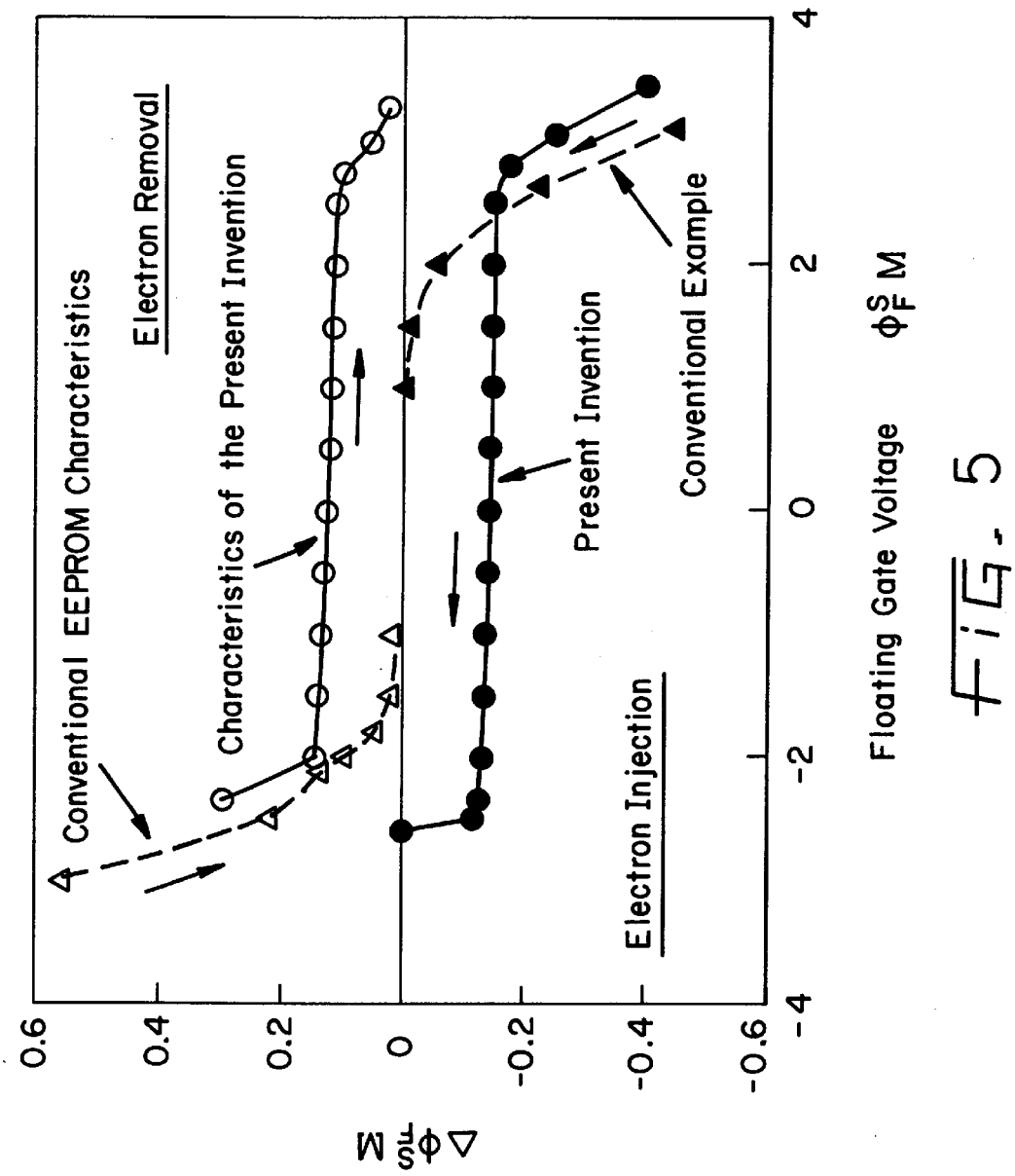
FIG. 5 shows the results of measurements conducted with respect to the circuitry shown in FIG. 1.

By means of repeating this series of operations, under identical conditions, a standardized amount of electrons is injected into or removed from the floating gate at each single pulse. FIG. 5 shows the results of a measurement with respect to the circuitry shown in FIG. 1 and these results confirm this; the floating gate voltage $\Phi_F^S$ in the standby state of operations is plotted along the horizontal axis, while the amount of change $\Delta\Phi_F^S$ in the floating gate voltage when injection or removal of electrons is carried out by means of a single pulse under identical conditions in the floating gate voltage is plotted on the vertical axis. In the circuit in which the measurement results of FIG. 5 were obtained, a value of $-2.5$ V was used for $V_{TN}^*$; however, insofar as $\Phi_F^S-V_{TN}^*$ is within the range of the power source voltage, that is to say, so long as $-2.5$ V$<\Phi_F^S<2.5$ V, the amount of change $\Delta\Phi_F^S$ remains constant. The $\Delta\Phi_F^S$ of the characteristics of a conventional E²PROM decreases exponentially with respect to the floating gate voltage, and this is plotted for reference proposes. The black arrows in the Figure indicate the direction of change in accordance with the carrying out of injection or removal of electrons. When $\Phi_F^S$ has other values, that is to say, when $\Phi_F^S-V_{TN}^*$ is outside the range of the power source voltage, then the characteristics of a conventional E²PROM appear, and the constant value is lost; however, this presents no problem. The reason for this is that it is possible to prevent a breakdown in insulation of the oxide film which is produced by the excessive injection of charge into the floating gate or the excessive removal of charge therefrom. Furthermore, with respect to the synapses of the neural network, when hardware learning is conducted, the values of the synapse weighting, that is to say, the amount of charge within the floating gate, reaches a maximum or a minimum, these values automatically become incapable of further alteration, and this is a highly desirable result in a hardware learning algorithm.

In the measurement results shown in FIG. 5, a value of $-2.5$ V was used as $V_{TN}^*$; however, at other threshold values, the region within which $\Delta\Phi_F^S$ remains constant is merely shifted, so that identical results can be obtained. Additionally, FIG. 6 shows actually measured data comparing both a conventional example and the present embodiment. In FIG. 6, after conducting one continuous injection operation, the threshold value $V_{TH}$ of the NMOS 102 as seen from terminal 106 was measured. The amount of change $\Delta V_{TH}$ in the threshold value and the amount of change $\Delta\Phi_F^S$ in the floating gate voltage were identical, and using C as a constant, the relationship is one in which $V_{TH}=\Phi_F^S+C$.

Figure 7:
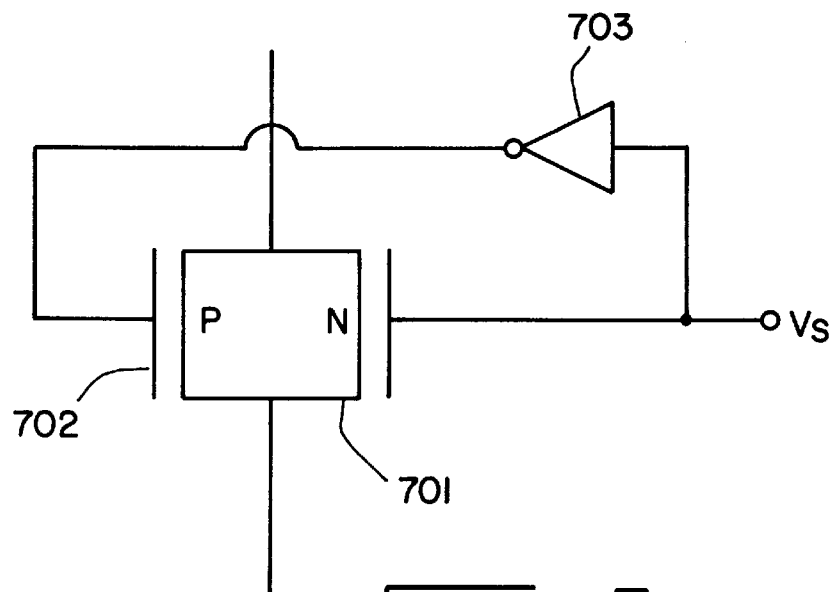
FIG. 7 is a circuit diagram explaining the first embodiment of the present invention.

Here, at non-programming intervals, $V_P=V_E=0$ was established; however, $V_P$ and $V_E$ may represent other voltages. Additionally, with respect to $C_T$, $C_0<<C_P$, and $C_E$, $C_T=C_0=0$, so that this could ignored; however, this was done in order to simplify the explanation, and it is of course the case that other values may be employed. Furthermore, the threshold value of NMOS 105 was set to 0 V; however, this may be set to other values. For example, if the threshold value of NMOS 105 is set to $V_{TN}$, then when $V_{TN}>0$, the maximum potential of electrode 107 only rises to $V_S-V_{TN}$. However, for example, $V_S$ may be set to a value of $V_{DD}$ or more using a bootstrap circuit or the like. Alternatively, in place of NMOS 105, the so-called CMOS switch shown in FIG. 7 may be employed. In FIG. 7, reference 701 indicates an NMOS transistor, reference 702 indicates a PMOS transistor, and reference 703 indicates a standard inverter.

The highly precise control of the amount of charge within the floating gate using single pulses under identical conditions, which was conventionally impossible when using floating gate type E²PROM non volatile memory without an external control circuit, as a result of the dependence of the Fowler-Nordheim tunneling current on the difference of potential between the ends of the insulating film, has become possible by means of the present invention without the use of an external control circuit, and moreover, by means of simple circuitry. As a result, although in conventional neural networks the amounts of charge within E²PROM floating gates was monitored and precisely controlled one by one by means of a large scale computer, so that a very large amount of time was required, by means of the present invention, this is completed after only one programming pulse, and the learning time is greatly shortened.

(Embodiment 2)

Figure 8:
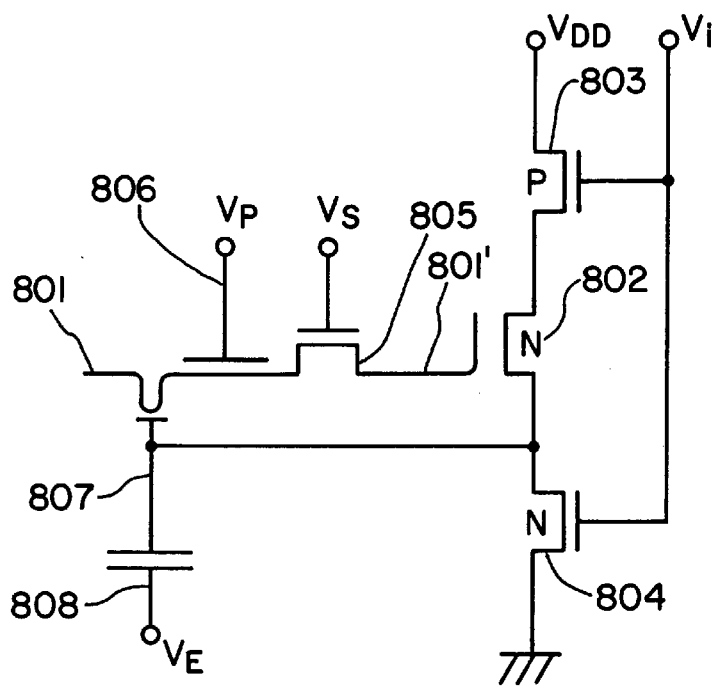
FIG. 8 is a circuit diagram explaining a second embodiment of the present invention.

FIG. 8 is a circuit diagram explaining a second embodiment of the present invention.

The points of difference from FIG. 1 are that the floating gate 101 in FIG. 1 is divided into a region having an NMOS transistor and region having $V_P$ and $V_T$, where these two regions are connected via a switching transistor 805, and that NMOS transistor 105 is omitted.

In the Figure, $V_i$ represents a control signal; it has the values of, for example, $V_{DD}$ or 0. References 801 and 801' indicate floating gates which are divided by switching transistor 805. 801' forms the gate electrode of NMOS transistor 802. Reference 803 indicates a PMOS transistor, while reference 804 indicates an NMOS transistor. The gates of PMOS transistor 803 and NMOS transistor 804 are connected to the $V_i$ signal line, while the gate of switching transistor 805 is connected to the $V_S$ line. Reference $V_P$ indicates an electrode for programming pulse application; this can also be used as an input gate for determining the potential of floating gate 801. Furthermore, reference $V_E$ also represents an electrode used for programming pulse application. A SiO$_2$ film having a thickness, for example, of 100 Å, is formed between floating gate 801 and writing electrode 807, and when the difference in potential in these becomes sufficiently large, for example, reaching a level of 10 V, then a current is caused to flow as a result of the Fowler-Nordheim tunneling phenomenon, and the amount of charge $Q_F$ within the floating gate changes. Here, if the potential of the floating gate is represented by $\Phi_F^S$, then this is described by the following formula:

$$\Phi_F^S=(C_PV_P+C_TV_T+Q_F)/(C_P+C_T+C_0) \qquad (7)$$

Here, $C_P$ represents the capacity between $V_P$ electrode 806 and floating gate 801, $C_T$ represents the capacity between $V_T$ electrode 807 and the floating gate 801, and $C_0$ represents the floating capacity. Furthermore, the capacity between $V_E$ electrode 808 and electrode 807 is represented by $C_E$.

With respect to the operation, the NMOS 105 of Embodiment 1 is eliminated, and in its place, a switching transistor 805 is added, and the changes in potential of all electrodes $V_i$, $V_P$, $V_E$, $V_S$, and $V_T$ are unaffected thereby.

The basic principle thereof is that, because if the switching transistor is placed in an OFF state, the floating gate is divided into the two portions 801 and 801', the potential of 801' of NMOS 802 remains constant even if programming pulses are applied to $V_P$ or $V_E$ during the injection or removal of electrons. By means of this, the value $\Phi_F^S-V_{TN}^*$ read out from electron 807 can be maintained at a constant level even while programming pulses are being applied to $V_P$ or $V_E$. Accordingly, effects identical to those of the first embodiment can be obtained.

(Embodiment 3)

Figure 9:
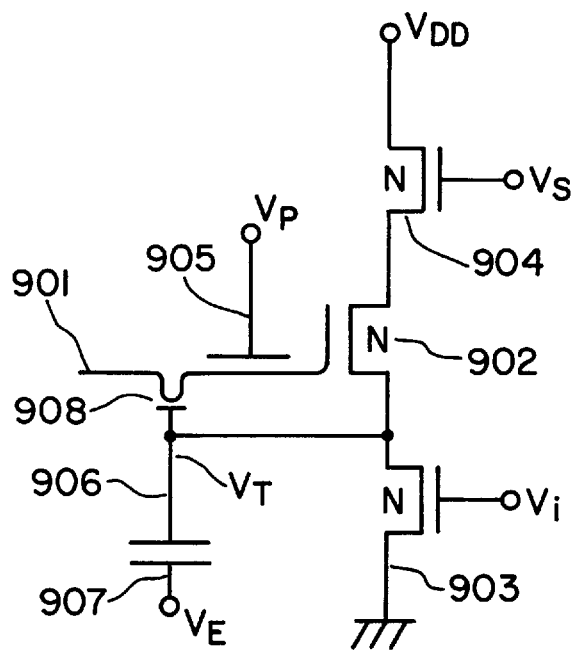
FIG. 9 is a circuit diagram explaining a third embodiment of the present invention.

FIG. 9 shows a third embodiment of the present invention.

The differences between this embodiment and that shown in FIG. 1 are that the PMOS transistor 103 in FIG. 1 is replaced by an NMOS transistor 904, the gate electrode of this NMOS transistor 904 is connected to the $V_S$ signal line, and the NMOS transistor 105 is eliminated.

Reference 901 indicates a floating gate; this functions as the gate electrode of NMOS transistor 902. Reference 903 indicates an NMOS transistor. The gate of NMOS 903 is connected to the $V_i$ signal line. $V_P$ represents an electrode for the application of programming pulses; it may also be employed as an input gate for determining the potential of floating gate 901. Furthermore, $V_E$ also represents an electrode which is employed for the application of programming pulses. A SiO$_2$ film having a thickness of, for example, 100 Å is formed between floating gate 901 and writing electrode 906, and when the difference in potential between these two is sufficiently large, for example, when this difference reaches approximately 10 V, then a current flows as a result of the Fowler-Nordheim tunnelling phenomenon, and the amount of charge $Q_F$ within floating gate 901 changes. Here, if the potential of the floating gate is represented by $\Phi_F^S$, then this is described by the following formula:

$$\Phi_F^S=(C_PV_P+C_TV_T+Q_F)/(C_P+C_T+C_0) \qquad (8)$$

Here, $C_P$ represents the capacity between the $V_P$ electrode 905 and the floating gate 901, $C_T$ represents the capacity between the $V_T$ electrode 906 in the floating gate, while $C_0$ represents the floating capacity. Furthermore, the capacity between $V_E$ electrode 907 and electrode 906 is represented by $C_E$.

With respect to operations, the PMOS 103 and NMOS 105 of Embodiment 1 were eliminated, and in their place, a NMOS transistor 904 was added, and thereby, the changes in potential of all of the electrodes $V_i$, $V_P$, $V_E$, $V_S$, and $V_T$ remain unaffected.

The basic principle thereof is that, if the NMOS transistor 904 is in an OFF state, the drain terminal of the NMOS transistor 902 is cut off from the power source, so that the potential of the source terminal NMOS terminal 902, that is to say, of $V_T$ electrode 906, remains constant even if programming pulses are applied to $V_P$ or $V_E$ during the injection or removal of electrons. By means of this, the value $\Phi_F^S-V_{TN}^*$ which was read out of electrode 906 remains constant even while programming pulses are being applied to $V_P$ or $V_E$. Accordingly, effects can be obtained which are identical to those of the first embodiment.

(Embodiment 4)

In Embodiments 1 through 3 described above, an NMOS transistor having a floating gate was replaced by a PMOS transistor, and the polarity of a transistor having a gate connected to the $V_i$ signal line was reversed, that is to say, an NMOS transistor was replaced by an PMOS transistor, and a PMOS transistor was replaced by an NMOS transistor, and furthermore, the polarity of the two power supply lines was reversed, and the signal line $V_i$ was made an inverted $V_i$, and even when these things were carried out, effects could be obtained which were identical to those of Embodiment 1 by means of operations which were identical to those of Embodiment 1.

(Arithmetical Formula 3)

inverted $V_i \ldots \overline{V_i}$ (identical hereinbelow)

(Embodiment 5)

Figure 10:
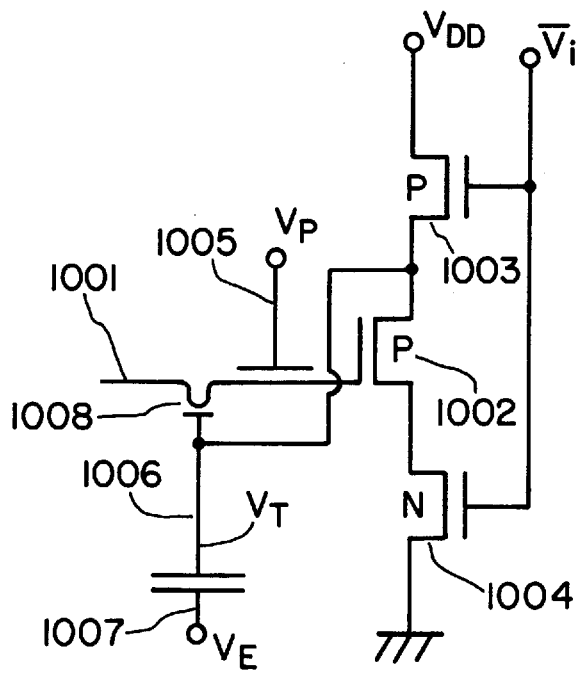
FIG. 10 is a circuit diagram explaining a fifth embodiment of the present invention.

FIG. 10 is a circuit diagram showing a fifth embodiment of the present invention.

The differences between this embodiment and that shown in FIG. 1 are that the NMOS transistor 102 in FIG. 1 is replaced by a PMOS transistor 1002, the $V_T$ electrode 107 in FIG. 1 is connected not to the source terminal of the NMOS transistor 102 in FIG. 1, but rather to the source terminal of the PMOS transistor 1002, and the NMOS transistor 105 in FIG. 1 is eliminated.

In FIG. 10, reference 1001 indicates a floating gate; this functions as the gate electrode of PMOS transistor 1002. Reference 1003 indicates a PMOS transistor, while reference 1004 indicates a NMOS transistor. The gates of PMOS 1003 and NMOS 1004 are connected to the $V_i$ signal line. $V_P$ represents an electrode for programming pulse application; this may also function as an input gate for determining the potential of floating gate 1001. Furthermore, $V_E$ also represents an electrode for programming pulse application. A SiO$_2$ film having a thickness of, for example, 100 Å, is formed between floating gate 1001 and writing electrode 1006, and when the difference in potential between these is sufficiently large, for example, when this difference reaches a level of 10 V, a current is caused to flow as a result of the Fowler-Nordheim tunneling phenomenon, and the amount of charge $Q_F$ within floating gate 1001 changes. Here, if the potential of the floating gate is represented by $\Phi_F^S$, then this is described by the following formula:

$$\Phi_F^S=(C_PV_P+C_TV_T+Q_F)/(C_P+C_T+C_0) \qquad (9)$$

Here, $C_P$ represents the capacity between $V_P$ electrode 1005 and floating gate 1001, $C_T$ represents the capacity between $V_T$ electrode 1006 and the floating gate, and $C_0$ represents the floating capacity. Furthermore, the capacity between $V_E$ electrode 1007 and electrode 1006 is represented by $C_E$.

With respect to the operation, the NMOS 105 of Embodiment 1 is eliminated, and the $V_S$ signal line is also eliminated, and as a result, the changes in potential of $V_i$, $V_P$, and $V_E$ remain unchanged. A point which should be noted is that the gates of PMOS 1003 and NMOS 1004 are connected not to the signal line of $V_i$ but to the signal line of the inverted $V_i$. By means of this, the potential $V_T$ of electrode 1006 is such that when $V_i=V_{DD}$, that is to say, when the inverted $V_i=0$, $V_T=V_{DD}$; however, when $V_i=0$, $V_{DD}$, that is to say, when the inverted $V_i=V_{DD}$, then the potential $V_T$ of electrode 1006 has a value of $\Phi_F^S-V_{TP}^*$, as in Embodiment 1. Here, $V_{TP}^*$ represents the threshold value of PMOS transistor 1002 as seen from the floating gate. In this state, a positive program voltage is applied to $V_P$ or $V_E$.

The basic operating principle is that, using the fact that when a positive voltage is applied to the floating gate of the PMOS transistor 1002, the PMOS transistor 1002 enters an ON state, after $V_i$ has become equal to 0, that is to say, the inverted $V_i$ has become equal to $V_{DD}$, the potential of the source terminal of PMOS 1002, that is to say, the potential of $V_T$ electrode 1006, remains constant even if positive programming pulses are applied to $V_P$ or $V_E$ during injection or removal of electrons. By means of this, the value $\Phi_F^S-V_{TP}^*$ read out of electrode 1006 can be maintained at a constant value even during the application of programming pulses to $V_P$ or $V_E$. Accordingly, effects identical to those of the first embodiment can be obtained.

(Embodiment 6)

Figure 11:
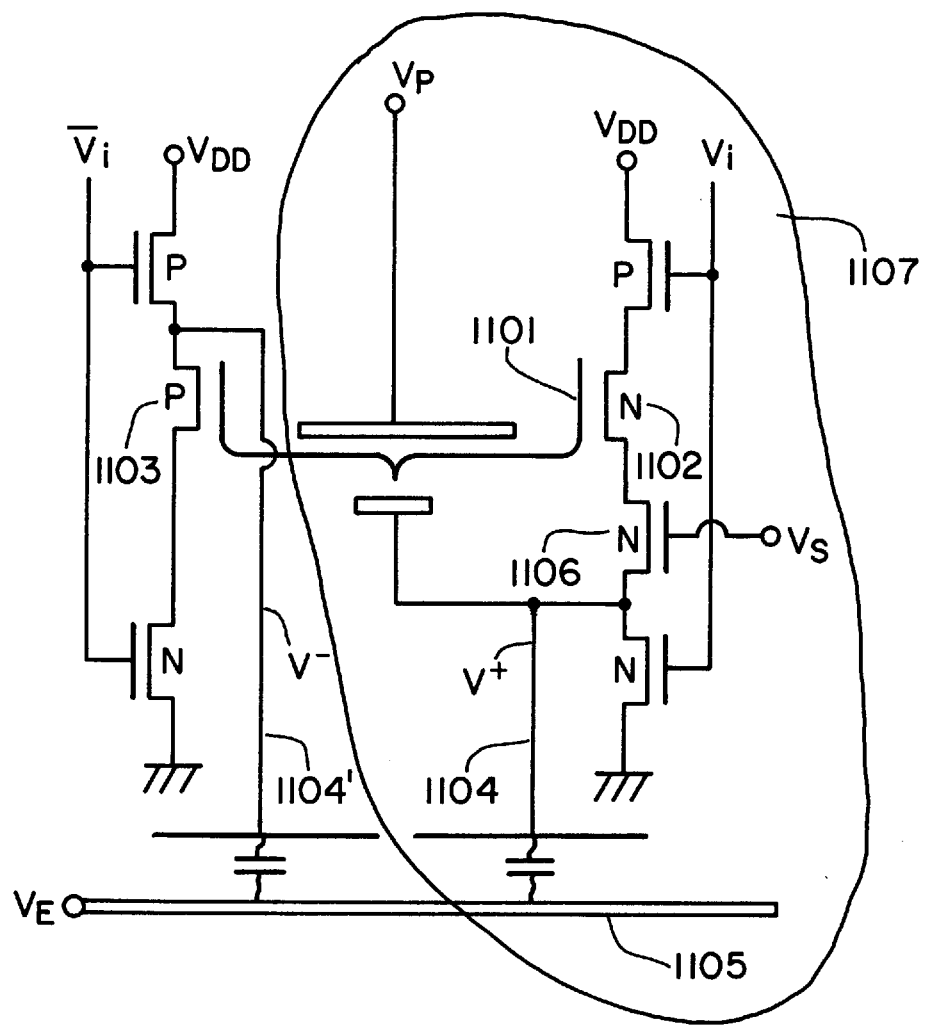
FIG. 11 is a circuit diagram explaining a sixth embodiment of the present invention.

FIG. 11 is a circuit diagram explaining a sixth embodiment of the present invention. As shown in this diagram, the present invention may be employed in a differential manner. In FIG. 11, reference 1101 indicates a floating gate, which serves as the gate electrode of NMOS transistor 1102 and PMOS transistor 1103. $V^+$ and $V^-$ represent output voltages which appear in the terminals 1104 and 1104', respectively, of this circuit; these are coupled with electrode 1105 via capacitors $C_1$ and $C_2$. Reference 1106 indicates an NMOS transistor, the gate electrode of which is connected to signal line $V_S$. If NMOS 1106 enters an ON state when $V_S=V_{DD}$, the potential of the floating gate 1101 is represented by $\Phi_F^S$, and the threshold values of NMOS transistor 1102 and PMOS transistor 1103 are represented by $V_{TN}^*$ and $V_{TP}^*$, respectively, then when $V_i=V_{DD}$, $V^+$ becomes equal to 0 and $V^-$ becomes equal to $V_{DD}$, and for example, if $C_1=C_2$, and electrode 1105 is placed in a floating state, then the potential $V_E$ of electrode 1105 becomes $V_{DD}/2$, and when $V_i=0$, $V^+$ becomes equal to $\Phi_F^S-V_{TN}^*$, and $V^-$ becomes equal to $\Phi_F^S-V_{TP}^*$, the potential $V_E$ of electrode 1105 becomes equal to $(2\Phi_F^S-V_{TN}^* -V_{TP}^*)/2$, and a value is read out which is the voltage of the floating gate shifted by a constant. If $|V_{TN}^*|=|V_{TP}^*|$, then $V_E=\Phi_F^S$, and the voltage of the floating gate is read out in an unchanged fashion to electrode 1105.

When injection or removal of electrons is conducted, an appropriate voltage is applied as $V_E$, and effects identical to those of Embodiment 1 can be obtained by means of operations identical to those of Embodiment 1.

Figure 12:
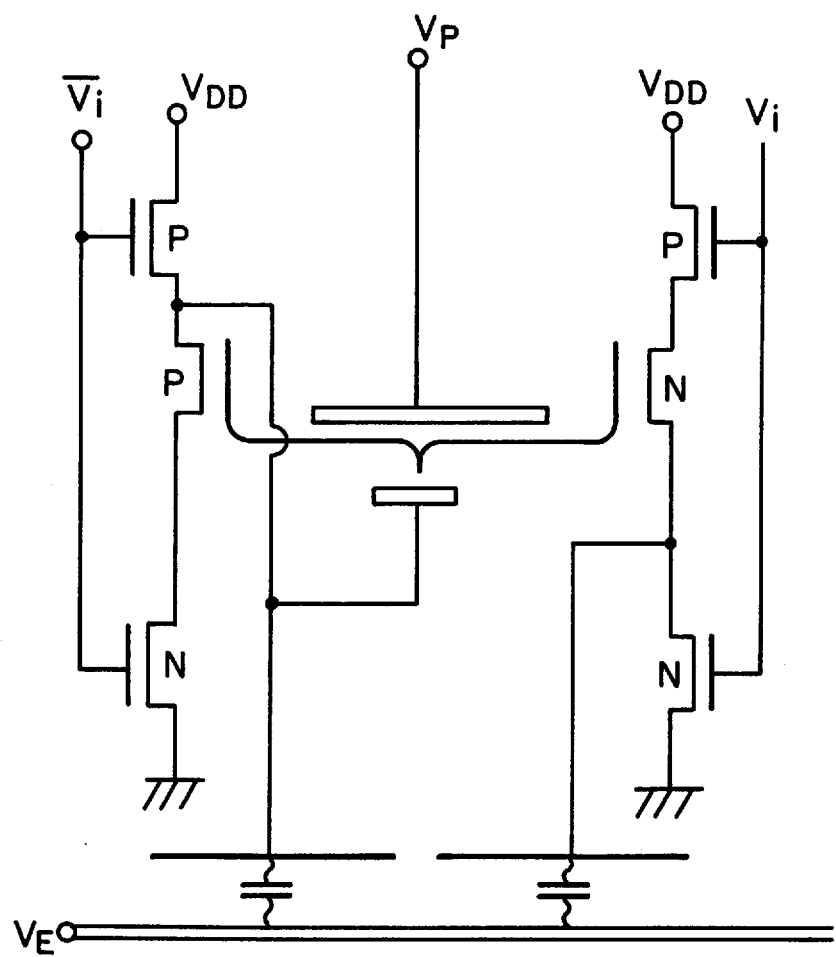
FIG. 12 is another circuit diagram explaining the sixth embodiment of the present invention.

Furthermore, it is of course the case that the portion marked 1107 may be exchanged for that in Embodiments 2–4. Furthermore, identical effects can be obtained with the circuitry shown in FIG. 12.

(Embodiment 7)

Figure 13:
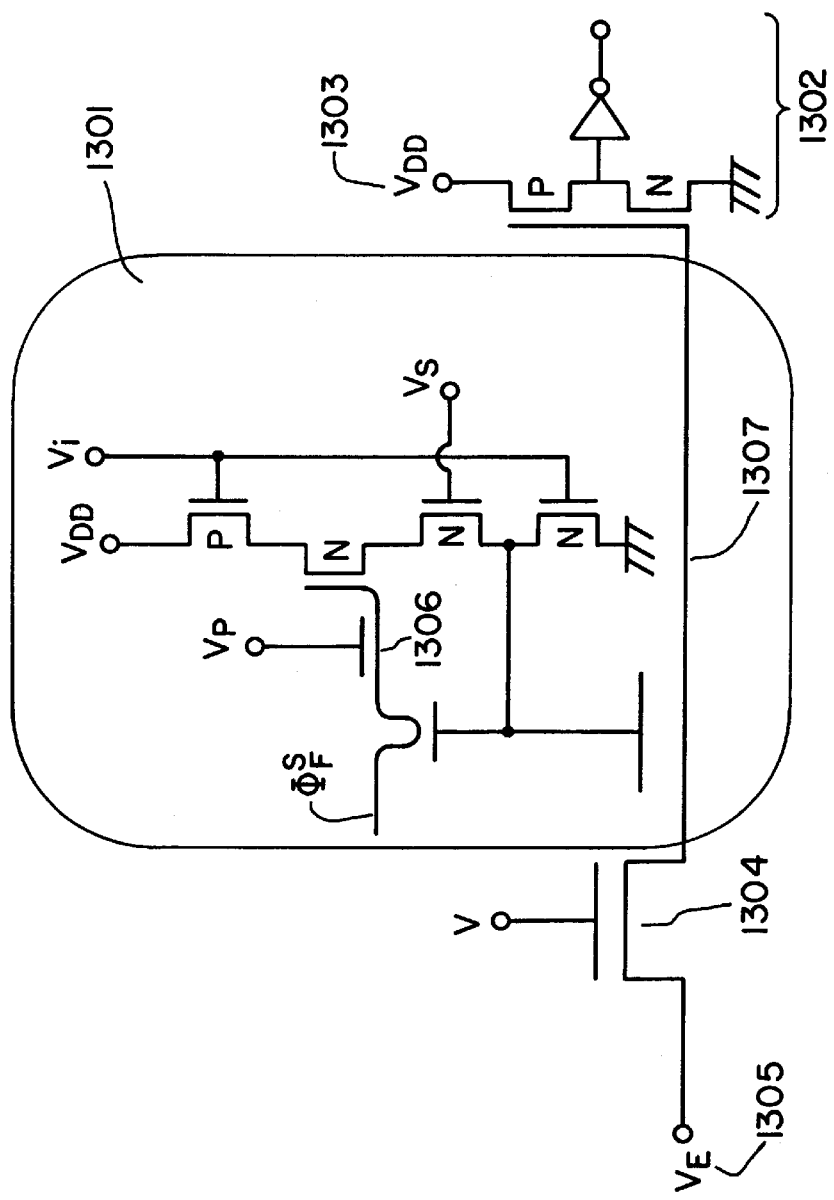
FIG. 13 is a circuit diagram explaining a seventh embodiment of the present invention.
Figure 14:
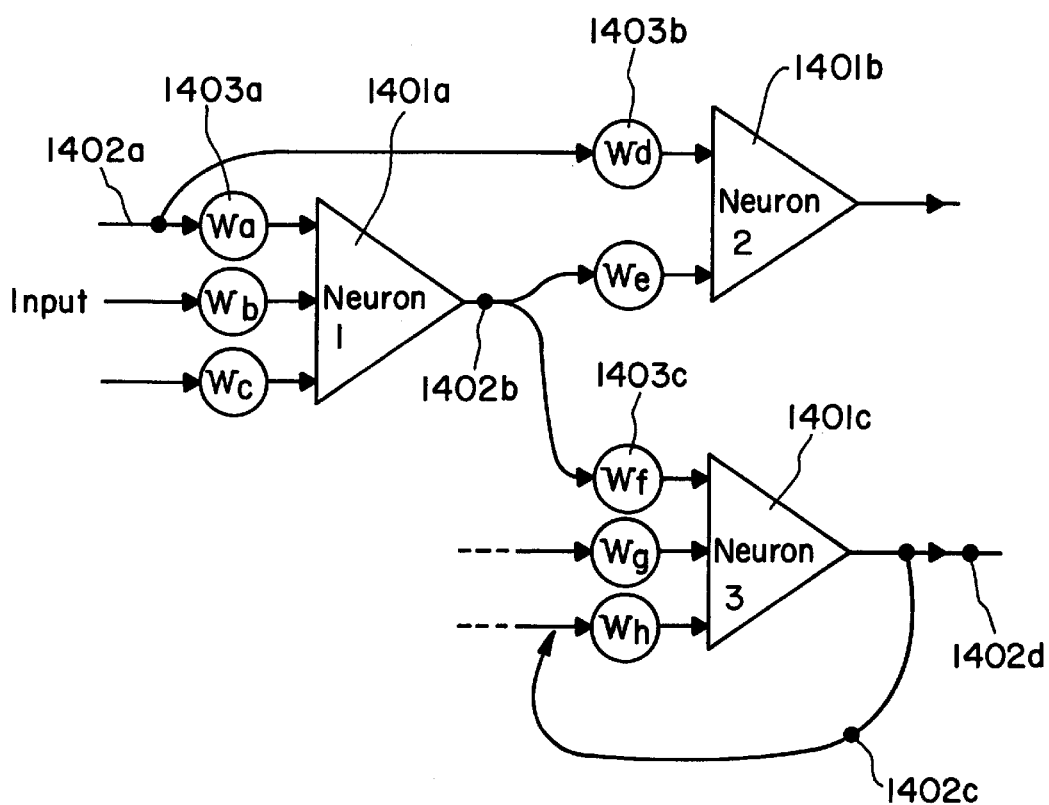
FIG. 14 shows a model of the fundamental unit of the brain.
Figure 15A:
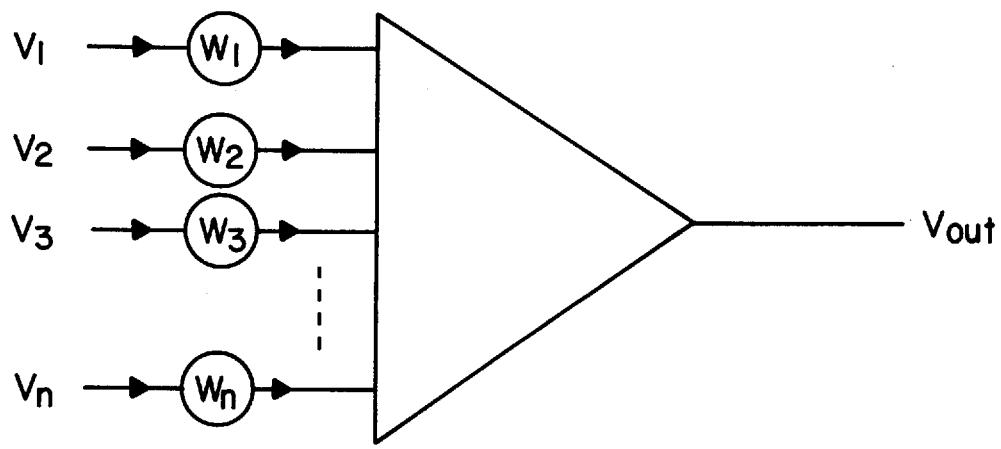
FIG. 15(a) is a conceptual diagram explaining the function of one nerve cell, that is to say, one neuron.
Figure 15B:
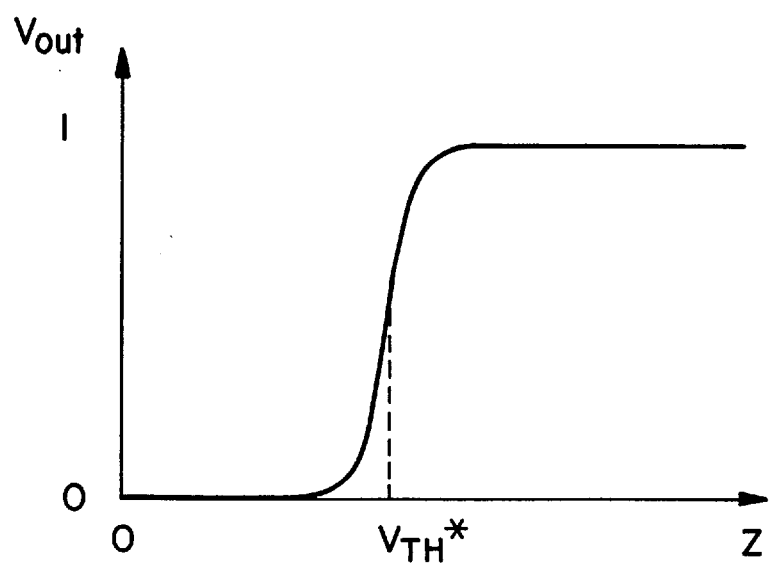
FIG. 15(b) is a graph showing the relationship between Z and $V_{out}$.
Figure 16:
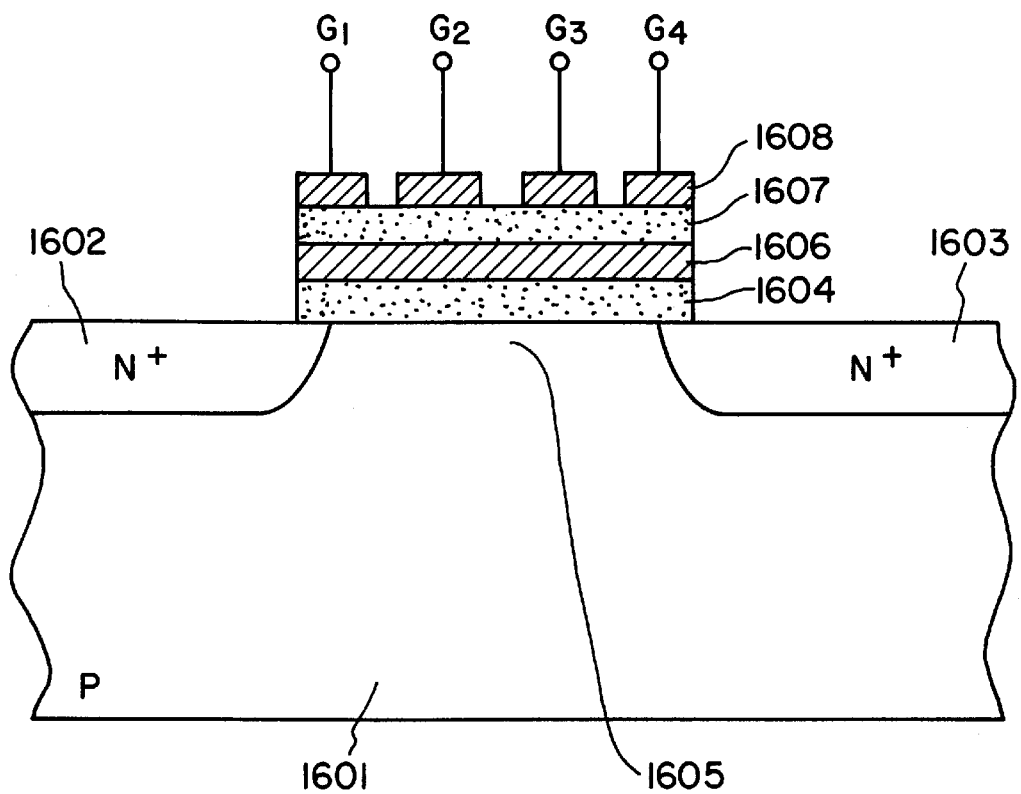
FIG. 16 is a conceptual diagram showing a simplification of an example of νMOS structure.
Figure 17:
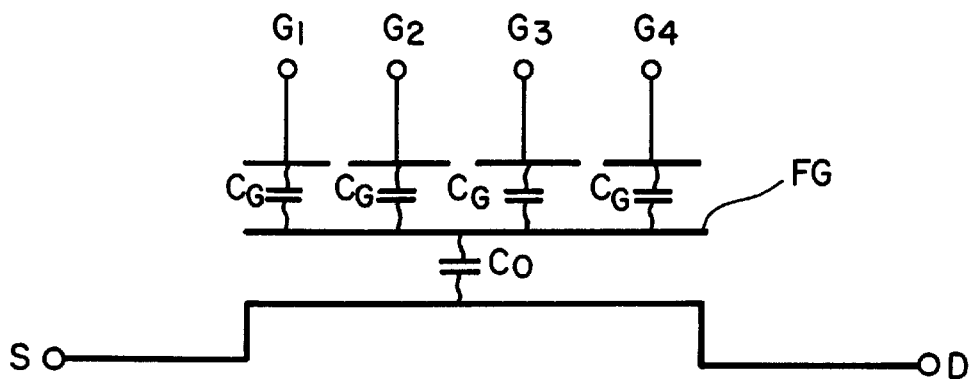
FIG. 17 shows a further simplification of the structure of FIG. 16.
Figure 18:
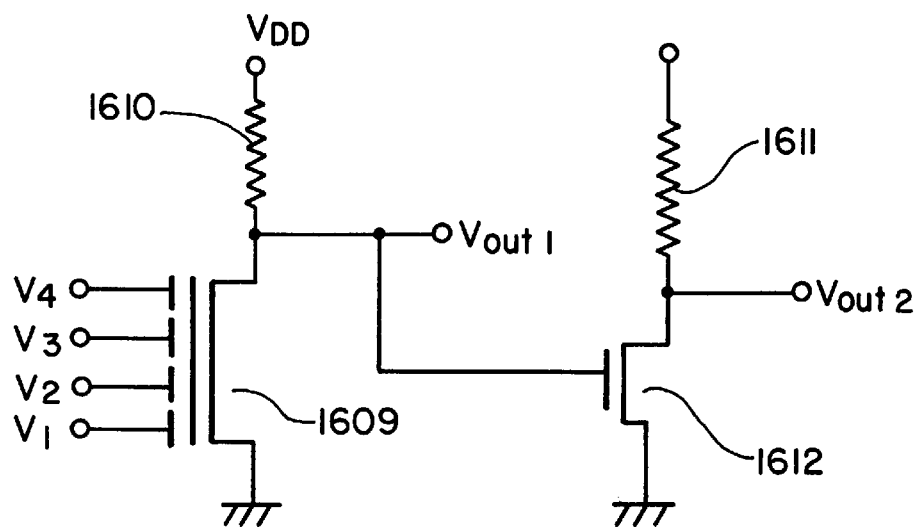
FIG. 18 is a circuit diagram of an inverter employing the neuron element of FIG. 16.
Figure 19:
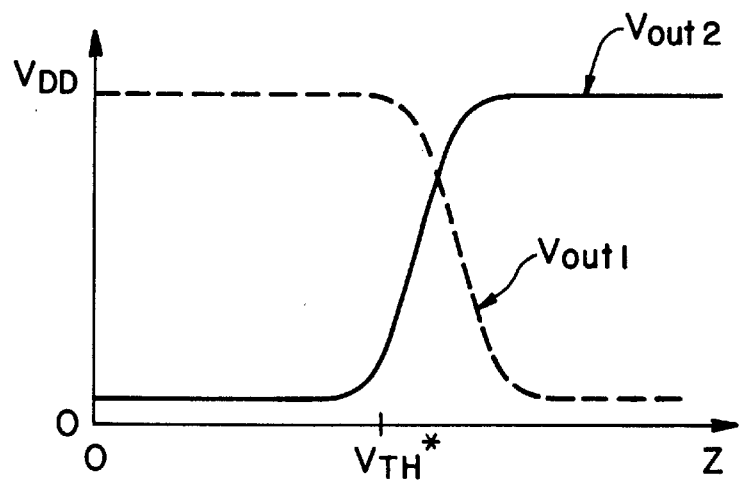
FIG. 19 is a graph showing the relationship between the $V_{out}$, $V_{in}$, and Z in the circuit of FIG. 18.
Figure 20:
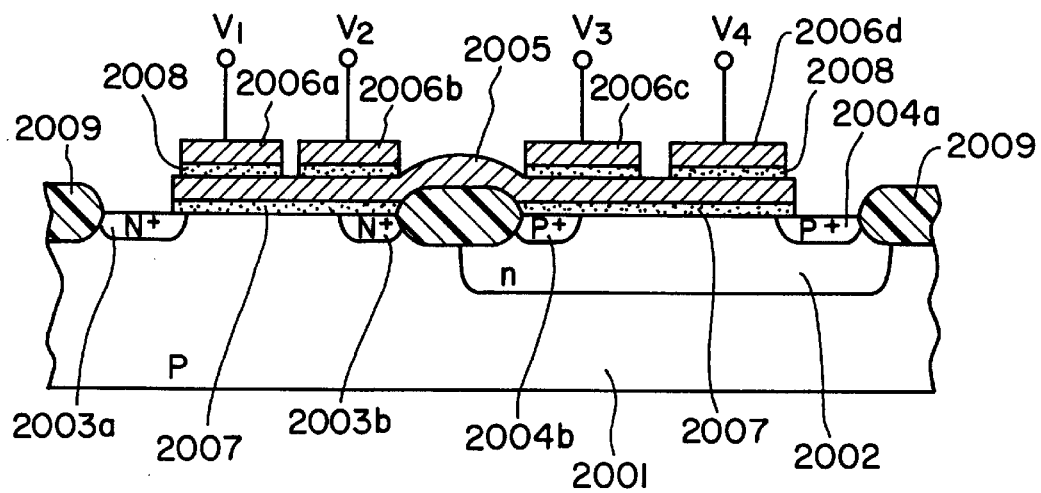
FIG. 20 shows the cross sectional structure of a CMOS neuron gate.
Figure 21:
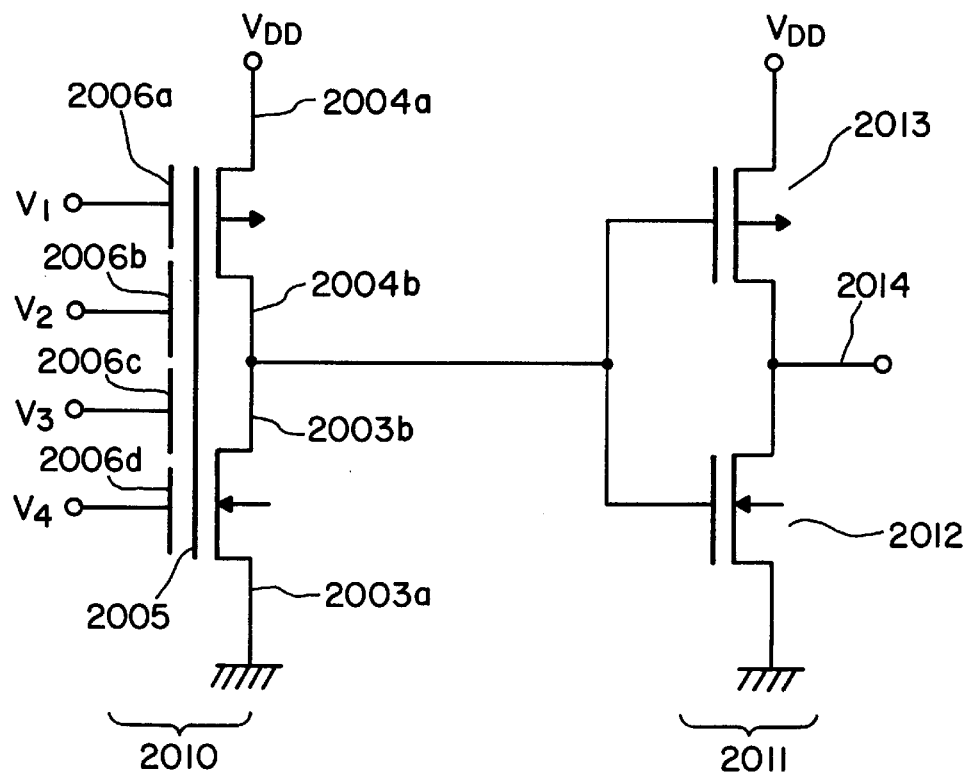
FIG. 21 is a circuit diagram showing the structure of one neuron circuit.
Figure 22:
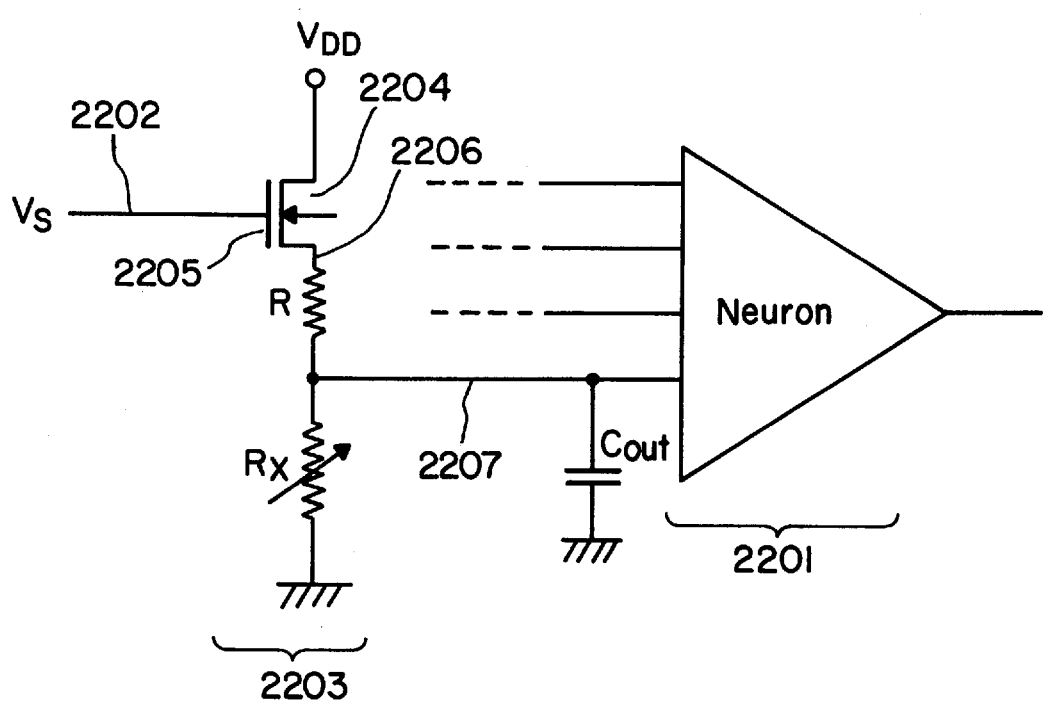
FIG. 22 is a circuit diagram showing an example of the fundamental structure of a neuron circuit containing synapse junctions which employ νMOS transistors in accordance with the conventional technology.
Figure 23A:
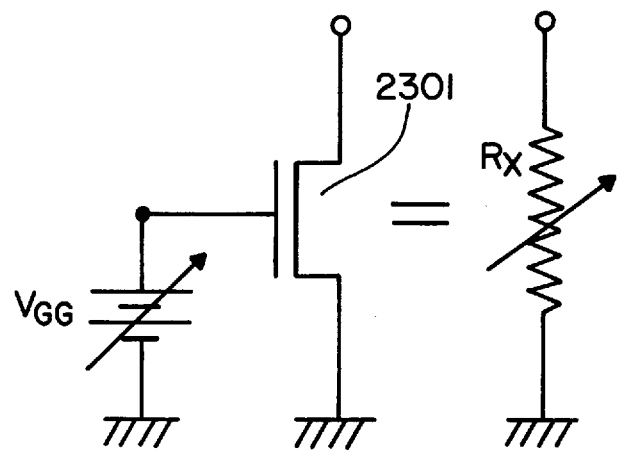
Figure 23B:
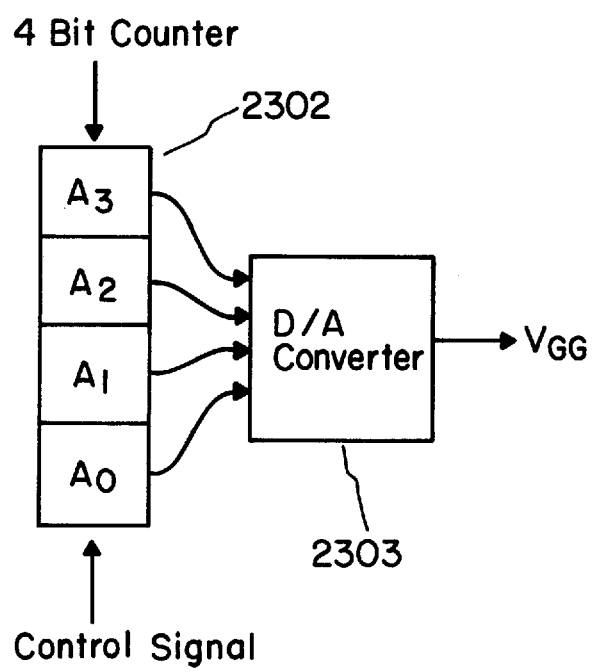
FIG. 23(b) is a circuit diagram showing an example of the control of the value of $V_{GG}$.
Figure 24A:
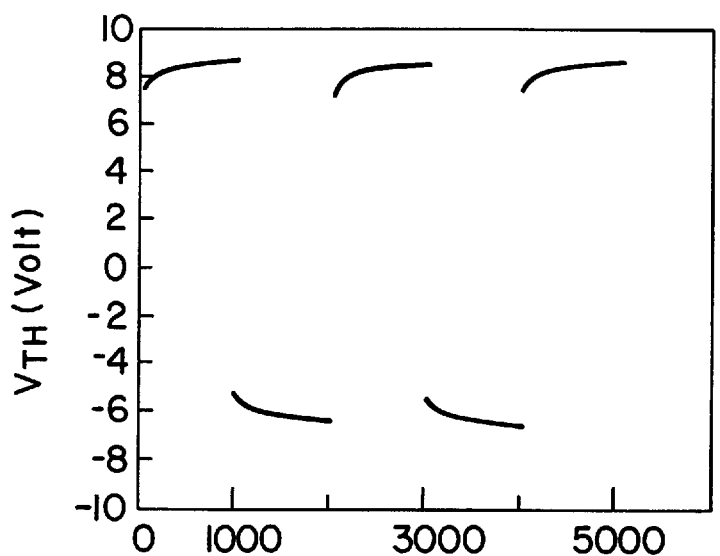
Figure 24B:
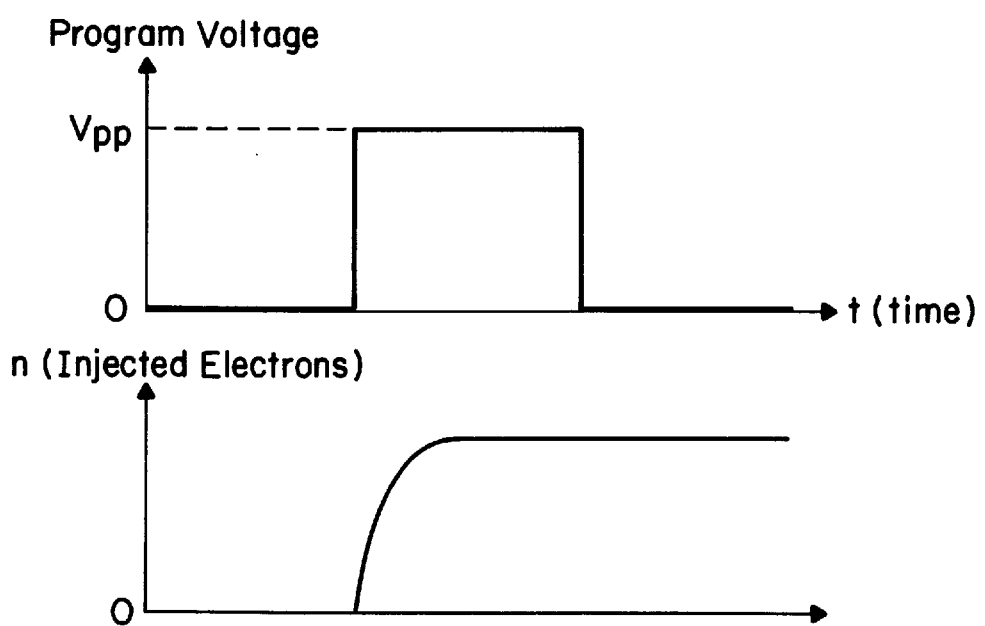
FIG. 24(b) is a graph showing the state of the change over time in the number (n) of electrons injected into the floating gate during the application of a positive program voltage in the form of a step function.

FIG. 13 is a circuit diagram showing a seventh embodiment of the present invention.

In this embodiment, the electrode 108 in FIG. 1 of Embodiment 1 is made the gate electrode of a CMOSvMOS inverter of a neuron circuit 1302, and this is coupled with signal line $V_E$ via switching transistor 1304.

The case is shown in which, in this circuit, reference 1301 is employed as a synapse of a neural network.

When electrons are injected or removed, the switching transistor 1304 is placed in an ON state, an appropriate voltage supplied as $V_E$, and thus effects identical to those of Embodiment 1 can be obtained by means of operations identical to those in Embodiment 1.

When the potential of the floating gate 1306 is read out, the switching transistor 1304 is placed in an OFF state, electrode 1307 is placed in a floating state, and when $V_i$ is set equal to 0 or $V_{DD}$, the output of the neuron circuit 1302 is determined by means of the value read out by means of capacitive coupling with electrode 1307.

In electrode 1307, a switching transistor which divides 1301 and 1302 may be provided.

Furthermore, 1301 may be operated in a differential manner as in Embodiment 6.

In Embodiments 1–7 described above, a plurality of electrodes for the application of programming pulses may be provided. By means of providing a plurality of such electrodes, programming may be conducted selectively. Additionally, it is of course the case that superior effects may be obtained if a plurality of Embodiments 1–7 are appropriately combined.

INDUSTRIAL APPLICABILITY

By means of the present invention, it is possible to construct a synapse junction using a small number of elements, and moreover, the power consumption thereof is extremely small, so that the large scale integration and reduction in power consumption of neural networks becomes possible. Additionally, the highly precise modification of synapse weighting becomes possible, and by means of this, it becomes possible for the first time to realize a neuron computer chip on a practically applicable level.

We claim:

1. A semiconductor device comprising:

a first MOS transistor including an electrically isolated floating gate electrode, said first MOS transistor further including a source electrode;

a first electrode for injecting a charge, said first electrode connected to said floating gate by means of a first insulating film;

a second electrode for application of a programing pulse to said device, said second electrode connected to said floating gate by means of a second insulating film;

a third electrode for application of an programming pulse to said device, said third electrode connected to said first electrode by means of a third insulating film;

and a second MOS transistor interconnecting said source electrode to said first electrode, whereby, after said second MOS transistor is placed in an on-state and the potential of said first electrode is set to a value which is determined by the potential of said floating gate by means of a charge supplied from said source electrode, said second MOS transistor is thereafter placed in an off-state, and a predetermined voltage pulse is applied to one of said second and third electrode charge transfer is caused between said floating gate and said first electrode.

* * * * *